(12) United States Patent
Izumi et al.

(10) Patent No.: US 8,270,212 B2
(45) Date of Patent: Sep. 18, 2012

(54) SEMICONDUCTOR MEMORY DEVICE INCLUDING ALTERNATELY ARRANGED CONTACT MEMBERS

(75) Inventors: Tatsuo Izumi, Kanagawa-ken (JP); Takeshi Kamigaichi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 176 days.

(21) Appl. No.: 12/910,674

(22) Filed: Oct. 22, 2010

(65) Prior Publication Data

US 2011/0096604 A1 Apr. 28, 2011

(30) Foreign Application Priority Data

Oct. 22, 2009 (JP) ................................ 2009-243535

(51) Int. Cl.
*G11C 11/15* (2006.01)
(52) U.S. Cl. ........ 365/173; 365/180; 365/174; 365/114; 365/103
(58) Field of Classification Search .................. 365/173, 365/180, 174, 114, 103
See application file for complete search history.

(56) References Cited

U.S. PATENT DOCUMENTS

2004/0140569 A1 7/2004 Meguro et al.
2007/0108618 A1* 5/2007 Hasunuma et al. ........... 257/758

FOREIGN PATENT DOCUMENTS

| JP | 6-318589 A | 11/1994 |
|---|---|---|
| JP | 2002-170935 A | 6/2002 |
| JP | 2004-146812 | 5/2004 |

OTHER PUBLICATIONS

Japanese Office Action drafted on May 9, 2011 in corresponding Japanese Application No. 2009-243535 (English Translation Only).

* cited by examiner

*Primary Examiner* — Thong Q Le
(74) *Attorney, Agent, or Firm* — Oblon, Spivak, McClelland, Maier & Neustadt, L.L.P.

(57) ABSTRACT

According to one embodiment, a semiconductor memory device includes first and second upper-layer contact members. The upper-layer contact members are arranged alternately with the first upper-layer contact members in a first direction and shifted in a second direction orthogonal to the first direction. Plugs are formed on the second upper-layer contact members. First metal wirings are provided on the first upper-layer contact members. Second metal wirings are provided on the plugs. A height of a top surface of the plugs is higher than a top surface of the first metal wirings. A width of a bottom surface of the first metal wirings in a shorter-side direction is shorter than a width of a top surface of the first metal wirings. A width of a bottom surface of the second metal wirings in a shorter-side direction is shorter than a width of a top surface of the second metal wirings.

19 Claims, 17 Drawing Sheets

A-A'

B-B'

A-A'

B-B'

A-A'

B-B'

A-A'

B-B'

SEMICONDUCTOR MEMORY DEVICE INCLUDING ALTERNATELY ARRANGED CONTACT MEMBERS

CROSS-REFERENCE TO RELATED APPLICATIONS

This application is based upon and claims the benefit of priority from Japanese Patent Application No. 2009-243535, filed Oct. 22, 2009, the entire contents of which are incorporated herein by reference.

FIELD

Embodiments described herein relate generally to a semiconductor memory device including a memory-cell array including a wiring layer.

BACKGROUND

Conventionally, semiconductor memory with small cell areas to store information is used for highly-integrated large capacity memory. In this type of semiconductor memory, a plurality of bit lines is formed on the same layer of the semiconductor chip as a wiring layer.

The miniaturization of memory cells, due to the higher integration of semiconductor memory in recent years, has caused the distance between bit lines to become narrower than before. Accordingly, the parasitic capacitance between adjacent bit lines has become larger, which may cause malfunctions of the semiconductor memory.

In addition, misalignment of bit lines may cause leakage current between a contact member connected to a bit line and another adjacent bit line, thereby possibly causing malfunctions of the semiconductor memory.

Because of the misalignment of bit lines, a possibility that leakage current may occur between a contact member connected to a bit line and another adjacent bit line causing a malfunction still remains.

In addition, misalignment of a bit line and a contact member connected to the bit line may cause a leakage current between the contact member connected to the bit line and another adjacent bit line.

BRIEF DESCRIPTION OF THE DRAWINGS

The invention is best understood from the following detailed description when read in conjunction with the accompanying drawings.

DETAILED DESCRIPTION

Figure 1:
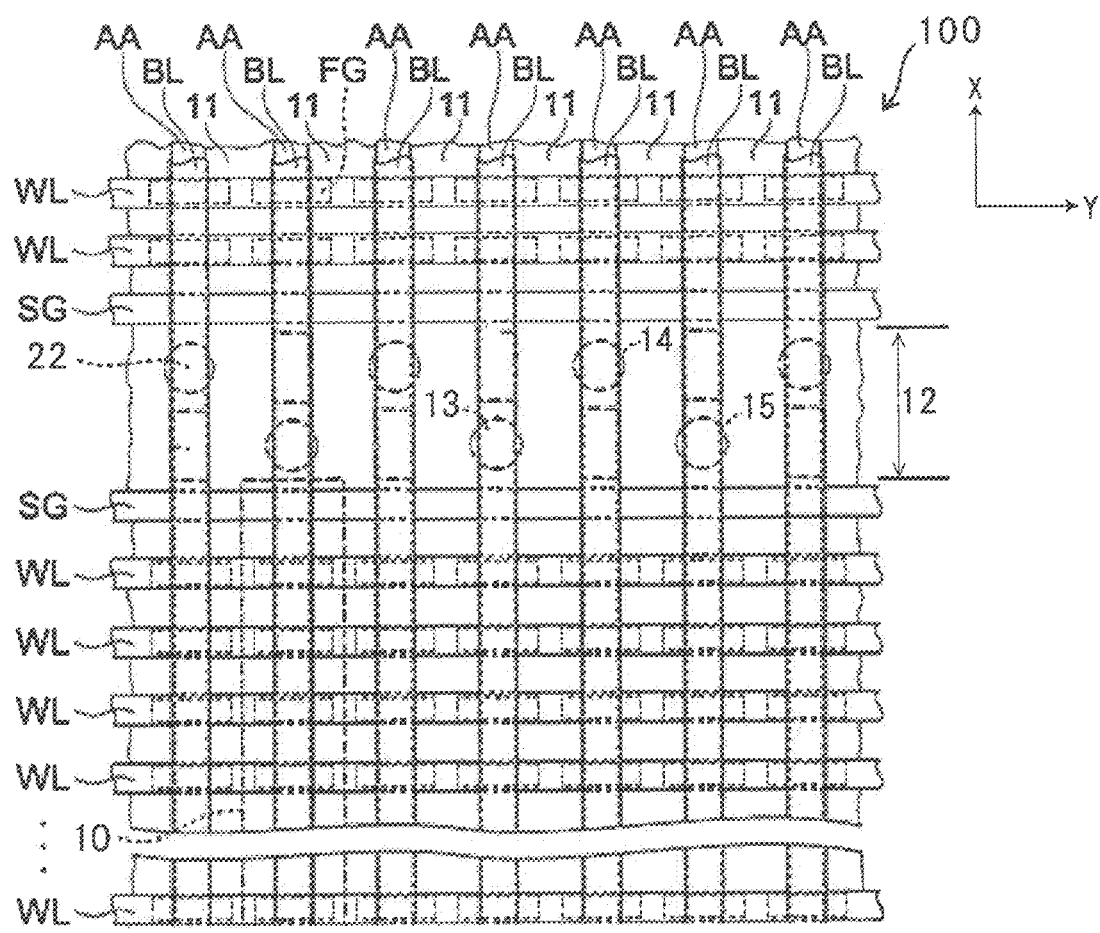
FIG. 1 is a schematic view showing a configuration of a semiconductor memory device according to a first embodiment.

In general, according to one embodiment, a semiconductor memory device includes a substrate, a plurality of first upper-layer contact members, a plurality of second upper-layer contact members, a plurality of plugs, a plurality of first metal wirings, and a plurality of second metal wirings. The plurality of first upper-layer contact members is formed over the substrate in a first layer. The plurality of second upper-layer contact members is formed over the substrate in the first layer, arranged alternately with the first upper-layer contact members in a first direction, and shifted from the plurality of first upper-layer contact members in a second direction orthogonal to the first direction. The plurality of plugs is formed respectively on the second upper-layer contact members and made of a metal. The plurality of first metal wirings is provided respectively on the first upper-layer contact members and made of a metal. The plurality of second metal wirings is provided respectively on the plugs and made of a metal. A height of a top surface of each of the plurality of plugs, measured from the substrate, is higher than a height of a top surface of each of the plurality of first metal wirings, measured from the substrate. A width of a bottom surface of each of the plurality of first metal wirings in a shorter-side direction is shorter than a width of a top surface of each of the plurality of first metal wirings in the shorter-side direction. A width of a bottom surface of each of the plurality of second metal wirings in a shorter-side direction is shorter than a width of a top surface of each of the plurality of second metal wirings in the shorter-side direction.

Some embodiments of the invention will be described below by referring to the drawings. The same constituent elements that appear across various drawings are denoted by the same reference numerals.

An illustrative embodiment provides a semiconductor memory device capable of reducing a leakage current between a first upper-layer contact member and a second metal wiring, a leakage current between a plug and a first metal wiring, and a leakage current between a second upper-layer contact member and the first metal wiring. The term, "contact member" refers generically to the entity including the first upper-layer contact member, the plug, and the second upper-layer contact member.

Figure 2A:
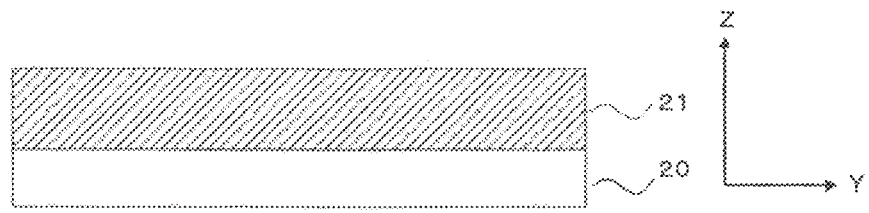
FIGS. 2A to 2E are schematic cross-sectional views of processes of manufacturing the semiconductor memory device according to the first embodiment.
Figure 2B:
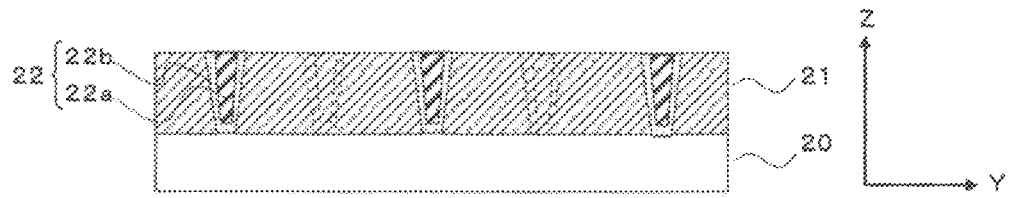
Figure 2C:
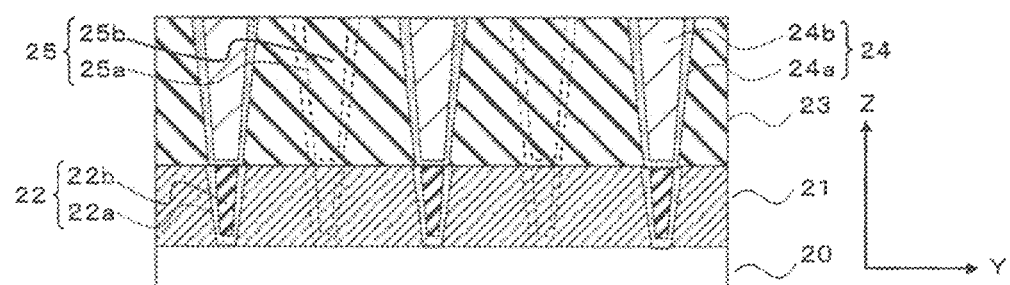

The configuration of a semiconductor memory device according to the first embodiment of the invention will be described by referring to FIGS. 1 and 2A to 2E. FIG. 1 is a schematic view showing the configuration of the semiconductor memory device according to the first embodiment. FIGS. 2A to 2E are schematic cross-sectional views of processes of manufacturing the semiconductor memory device according to the first embodiment, and FIG. 2E shows a section of a wiring portion of the semiconductor memory device according to the first embodiment. As FIGS. 1 and 2E show, a semiconductor memory device 100 of this embodiment includes a semiconductor substrate 20, NAND strings 10, lower-layer contact members 22, first upper-layer contact members 24, second upper-layer contact members 25, plugs 31, first metal wirings 28, and second metal wirings 32.

As FIG. 1 shows, each NAND string 10 includes a plurality of memory cells and selection gate transistors. Each of the plurality of memory cells is formed at the intersection of a word line WL and an active area AA as viewed from above, and the plurality of memory cells are connected in series in the lengthwise direction of the active area AA (i.e., in the X-direction in FIG. 1). The selection gate transistors are arranged at the two end portions of the plurality of memory cells.

A plurality of device-separating insulators 11, each of which extends in the X-direction in FIG. 1, is formed in the semiconductor substrate 20. The device-separating insulators 11 form active areas AA in the upper-layer portion of the semiconductor substrate 20. Bit lines BL are respectively formed over the active areas AA so as to overlap the active areas AA. On the other hand, a plurality of word lines WL, each of which extends in the Y-direction in FIG. 1, is arranged side by side in the X-direction in FIG. 1 at predetermined intervals. Selection gate lines SG are formed so as to sandwich these plurality of word lines WL.

As FIG. 1 shows and will be described next, the lower-layer contact members 22 are arranged on their respective active areas AA in a bit line contact area 12. For the sake of a simpler explanation, specific lower-layer contact members 13, 14, and 15, all of which are the lower-layer contact member 22 as shown in FIG. 1, are used in the following explanation. When the specific lower-layer contact member 13 is used as the reference, the adjacent lower-layer contact member 14 is arranged to be shifted in the X-direction. For example, in the case shown in FIG. 1, the lower-layer contact member 14 is arranged on the corresponding active area AA so as to be shifted in the positive X-direction. The lower-layer contact member 15, which is adjacent to the lower-layer contact member 14, is arranged at approximately the same position as that of the reference and the lower-layer contact member 13 in terms of the X-direction. A zigzag-patterned structure is thus formed.

Note that, the zigzag-patterned structure in this embodiment has two kinds of lower-layer contact members 22 located at different positions in the X-direction, but may have three kinds of such lower-layer contact members 22. Various modifications of this structure can be made.

The first upper-layer contact member 24 and the second upper-layer contact member 25 are provided on the lower-layer contact members 22, respectively, and thus are formed in the above-described zigzag-patterned structure. According to FIG. 2E, each of the first upper-layer contact members 24 and the second upper-layer contact members 25 has a laminate structure including a barrier metal layer 24a or 25a located at the bottom and a via layer 24b or 25b located at the top. In other words, the laminate structure is formed by depositing the material to be used for barrier metal layers after depositing the material to be used for via layers in openings.

The material used for the barrier metal layers 24a and 25a is, for example, TiN, and the material used for the via layers 24b and 25b is, for example, tungsten. The material used for the via layers 24b and 25b is generally a metal, and preferably copper.

The plugs 31 exist only above the second upper-layer contact members 25, respectively. The plugs 31 are provided so that the height, measured from the semiconductor substrate 20, of the second metal wiring 32 becomes higher than the height, measured from the semiconductor substrate 20, of the first metal wiring 28. The first metal wiring 28 and the second metal wiring 32 will be described later. The plugs 31 are arranged in every other active area AA, and are arranged substantially in parallel to the lengthwise direction of the word lines WL. Like the first upper-layer contact members 24 and the second upper-layer contact members 25, each of the plugs 31 has a laminate structure including a barrier metal layer (not illustrated) located at the bottom and a via layer (not illustrated) at the top. The material used for the barrier metal layer is, for example, TiN, and the material used for the via layer is, for example, tungsten.

The first metal wirings 28 are provided, respectively, over the first upper-layer contact members 24, and the second metal wirings 32 are provided, respectively, over the second upper-layer contact members 25. That is, the second metal wirings 32 are provided, respectively, over the plugs 31. Each of the first metal wirings 28 has a laminate structure including a barrier metal layer 28a at the bottom and a metal layer 28b at the top. The material used for the barrier metal layer 28a is, for example, Ti. The material used for the metal layer 28b is generally a metal and is not limited to a specific kind of metal. Nevertheless, it is preferable to use copper as the material for the metal layer 28b.

Figure 2D:
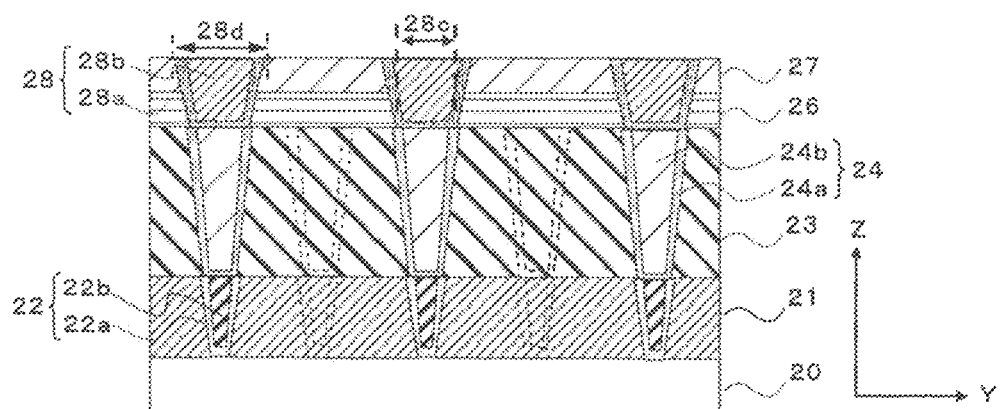
Figure 2E:
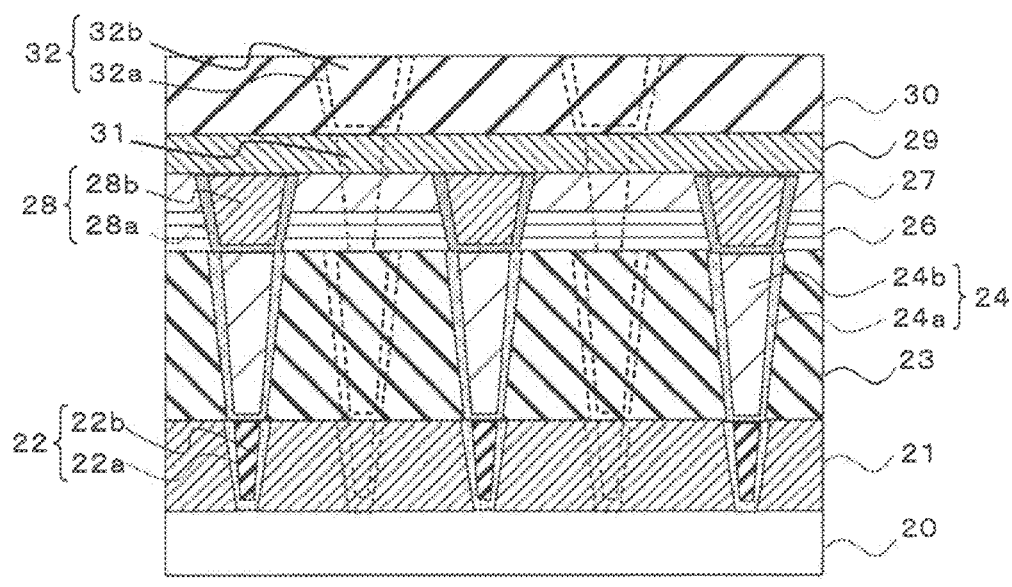

In addition, it is preferable that the width, in the Y-direction, of the bottom surface of each of the first metal wirings 28 and the second metal wirings 32 (i.e., a distance 28c in FIG. 2D) be smaller than the width of the top surface of each of the first metal wirings 28 and the second metal wirings 32 (i.e., a distance 28d in FIG. 2D). For example, the width, in the direction perpendicular to the corresponding active area AA, of the bottom surface of each of the first metal wirings 28 and the second metal wirings 32 ranges from 25 nm to 30 nm, whereas the width, in the direction perpendicular to the corresponding active area AA, of the top surface of each of the first metal wirings 28 and the second metal wirings 32 ranges from 30 nm to 35 nm.

As has been described thus far, a semiconductor memory device is provided in which the distance between each of the first metal wirings 28 and the corresponding second upper-layer contact member 25 and the distance between each of the second metal wiring 32 and the corresponding first upper-layer contact member 24 are increased. Thus the semiconductor memory device is capable of reducing the leakage current between the contact members and the metal wirings even if a misalignment occurs between a contact member and the metal wiring.

As discussed in JP-A-2004-136812, as the distance between each of the first metal wirings 28 and the corresponding second metal wiring 32 becomes larger, the parasitic capacitance between each of the first metal wirings 28 and the corresponding second metal wirings 32 becomes smaller. However, if a misalignment of bit lines occurs, the parasitic capacitance between the plug connected to one of the bit lines and another bit line adjacent to this bit line, e.g., the parasitic capacitance between each of the first metal wirings 28 and the corresponding second upper-layer contact member 25, does not become smaller.

In contrast, according to this embodiment, the distance between each of the first metal wirings 28 and the corresponding second upper-layer contact member 25 and the distance between each of the second metal wirings 32 and the corresponding first upper-layer contact member 24 can be made longer due to the configuration of the contact member formed in the zigzag-patterned structure. Accordingly, the parasitic capacitance between the plug connected to one of the bit lines and another bit line adjacent to this bit line can be reduced, thereby achieving significant reduction in the possibility of malfunctions.

Subsequently, a manufacturing method of the semiconductor memory device according to this embodiment will be described by referring to FIGS. 2A to 11. FIGS. 2A to 2E are schematic cross-sectional views of processes of manufacturing the semiconductor memory device according to the first embodiment.

Initially, as FIGS. 2A to 2E show, on a main surface of the semiconductor substrate 20, where devices to be the memory-cell array and the peripheral circuits are formed, an interlayer insulation film 21 (hereafter, referred to as the first interlayer insulation film) with a flatly-finished surface is formed (see FIG. 2A). After the formation of the first interlayer insulation film 21, photoresist is applied to the entire surface of the first interlayer insulation film 21, and then a desired resist pattern is formed by a photolithography technique. After that, using this resist pattern as a mask, the first interlayer insulation film 21 is dry-etched (e.g., by RIE), so that zigzag-patterned contact holes are formed in the first interlayer insulation film 21.

Then, after forming lower-layer contact members 22 in the contact holes of the first interlayer insulation film 21, the surface is flattened by chemical mechanical polishing (hereafter, abbreviated as CMP) (see FIG. 2B).

Subsequently, the manufacturing processes up to FIG. 2C will be described by referring to FIGS. 2C, 3, 4A, and 4B.

Figure 3:
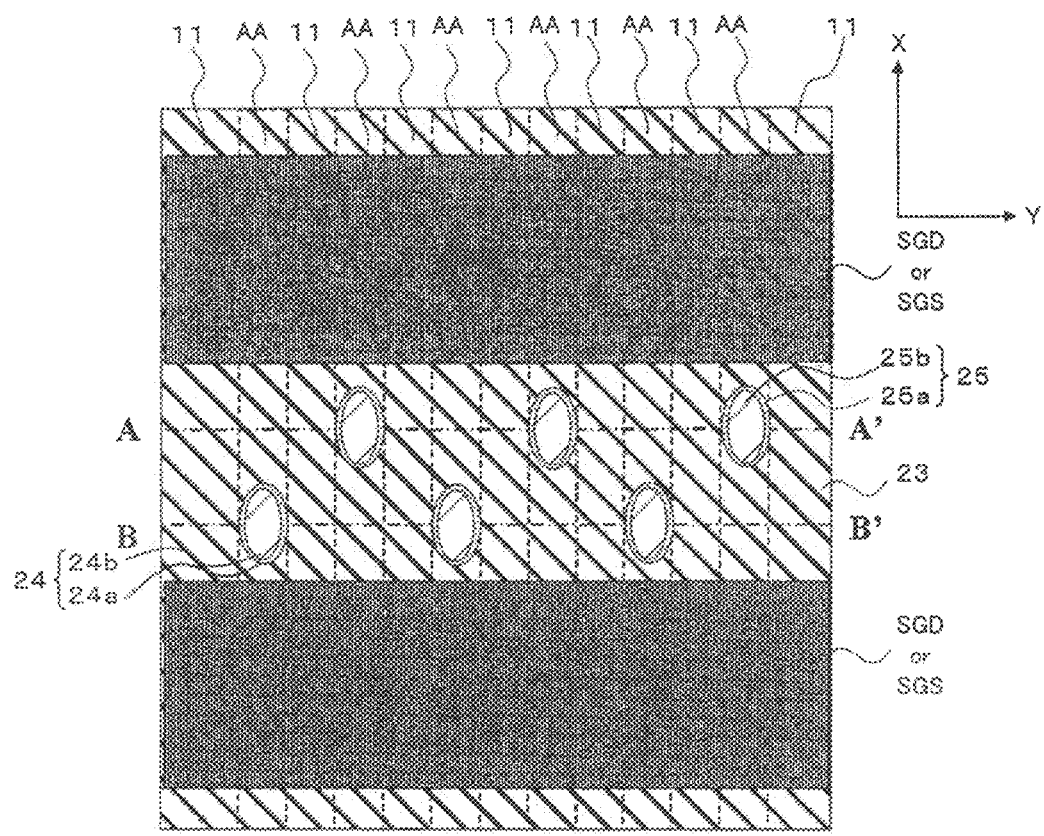
FIG. 3 is a plan view showing the manufacturing process of the semiconductor memory device shown in FIG. 2C.
Figure 4A:
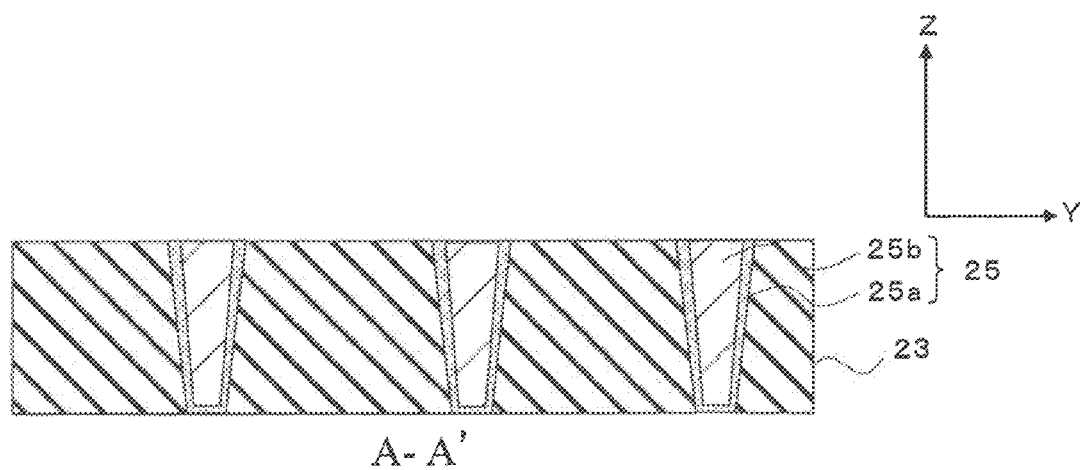
FIG. 4A is a cross-sectional view taken along the line A-A' of FIG. 3.
Figure 4B:
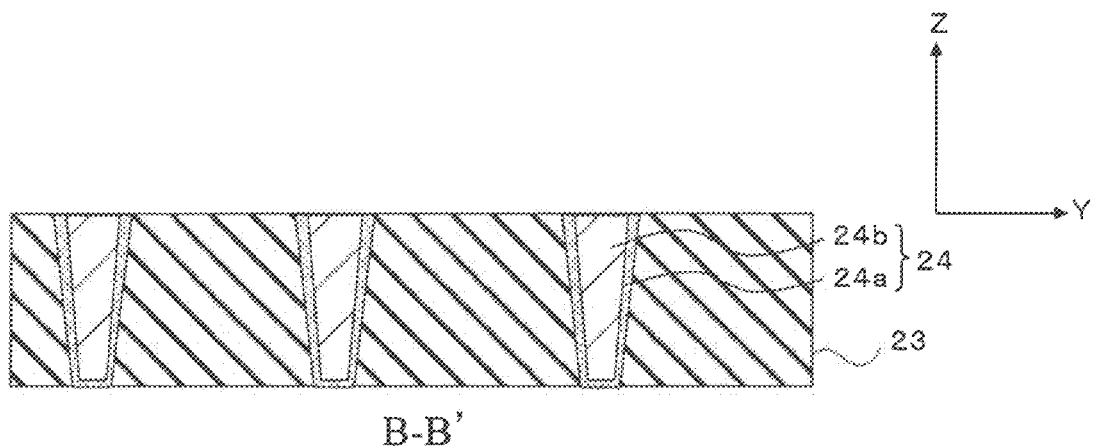
FIG. 4B is a cross-sectional view taken along the line B-B' of FIG. 3.

FIG. 3 is a plan view showing the manufacturing process of the semiconductor memory device shown in FIG. 2C. In addition, FIG. 4A is a cross-sectional view taken along the line A-A' of FIG. 3, and FIG. 4B is a cross-sectional view taken along the line B-B' of FIG. 3.

As FIG. 2C shows, another interlayer insulation film 23 (hereafter, referred to as the second interlayer insulation film) is formed on the lower-layer contact members 22 and on the first interlayer insulation film 21. Photoresist (not illustrated) is applied to the entire surface of this second interlayer insulation film 23, and then a desired resist pattern is formed by a photolithography technique. After that, using this resist pattern as a mask, the second interlayer insulation film 23 is dry-etched, so that zigzag-patterned openings which expose the top surfaces of the lower-layer contact members 22 are formed in the second interlayer insulation film 23. After the deposition of the second interlayer insulation film 23, the surface of the second interlayer insulation film 23 may be flattened by, for example, CMP.

After that, films with a laminate structure including the barrier metal layer 24a or 25a at the bottom and the via layer 24b or 25b at the top are formed respectively in the openings of the second interlayer insulation film 23. Then, the surfaces of the films thus formed are flattened by CMP so as to have a desired height. In this manner, the first upper-layer contact members 24 and the second upper-layer contact members 25 are buried in the openings formed in the second interlayer insulation film 23 (see FIG. 2C).

Figure 5:
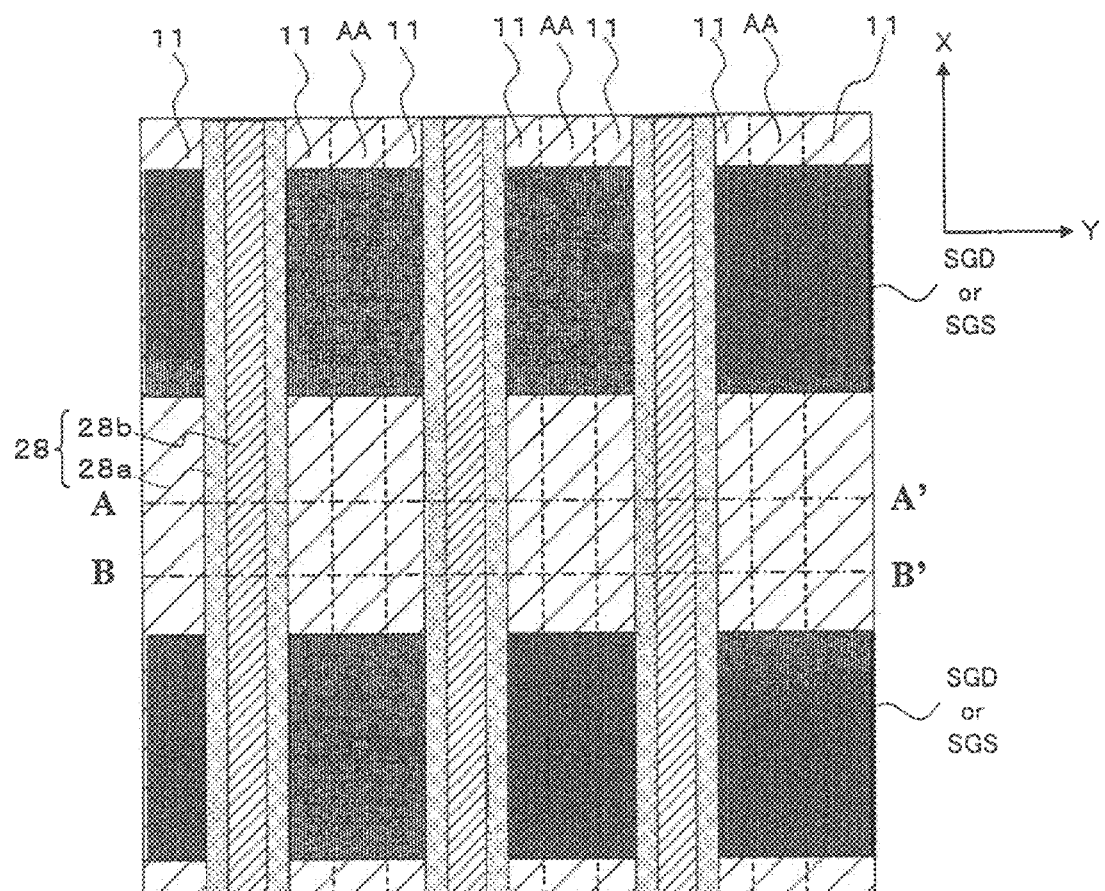
FIG. 5 is a plan view showing the manufacturing process of the semiconductor memory device shown in FIG. 2D.
Figure 6A:
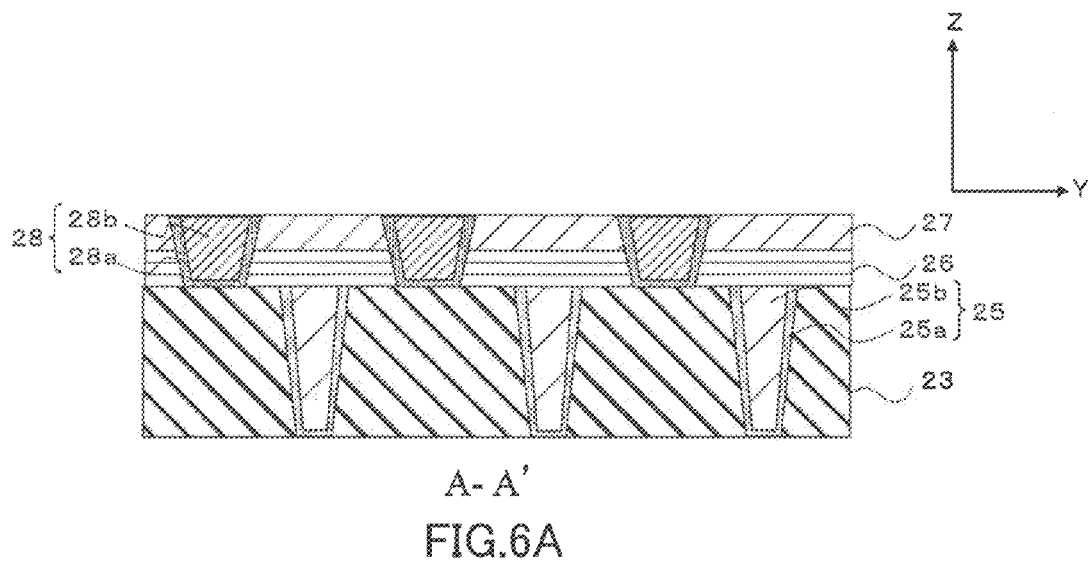
FIG. 6A is a cross-sectional view taken along the line A-A' of FIG. 5.
Figure 6B:
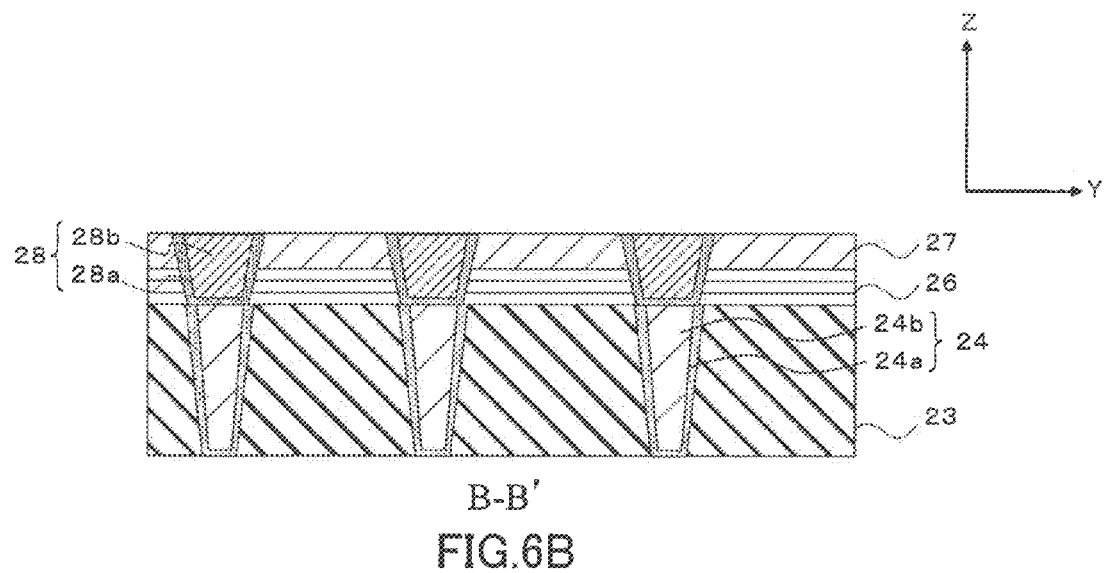
FIG. 6B is a cross-sectional view taken along the line B-B' of FIG. 5.

Subsequently, manufacturing processes up to FIG. 2D will be described by referring to FIGS. 2D, 5, 6A, and 6B. FIG. 5 is a plan view showing the manufacturing process of the semiconductor memory device shown in FIG. 2D. FIG. 6A is a cross-sectional view taken along the line A-A' of FIG. 5, and FIG. 6B is a cross-sectional view taken along the line B-B' of FIG. 5.

A laminate film including an etching-stopper film 26 (hereafter, referred to as the first etching-stopper film) at the bottom and an interlayer insulation film 27 (hereafter, referred to as the third interlayer insulation film) at the top are formed on the second interlayer insulation film 23, the first upper-layer contact members 24, and the second upper-layer contact members 25. After the surface of the laminate film is flattened by, for example, CMP, photoresist is applied to the entire surface of the third interlayer insulation film 27, and then a predetermined resist pattern is formed by a photolithography technique. Thereafter, the first etching-stopper film 26 and the third interlayer insulation film 27 are dry-etched using the resist pattern as a mask. Thus, openings extending in the X-direction and exposing at least parts of top surfaces of the first upper-layer contact members 24 are formed both in the first etching-stopper film 26 and in the third interlayer insulation film 27. After depositing the barrier metal film 28a in these openings, metal film 28b is deposited in these openings. Thus, films, each of which has a laminate structure, including the barrier metal film 28a at the bottom and the metal film 28b at the top are formed in each of these openings. Then, the surfaces of the films thus formed are flattened by CMP so as to have a desired height. In this manner, the first metal wirings 28 are formed (see FIG. 2D).

As FIG. 5 shows, the openings formed both in the first etching-stopper film 26 and in the third interlayer insulation film 27 are provided over every other of the active areas AA in parallel with the active areas AA, and exist only over the first upper-layer contact members 24. Accordingly, the first metal wirings 28 are formed, respectively, both in the openings and on the first upper-layer contact members 24 (FIG. 6B), while no first metal wirings 28 are formed on the second upper-layer contact members 25 (FIG. 6A).

Figure 7:
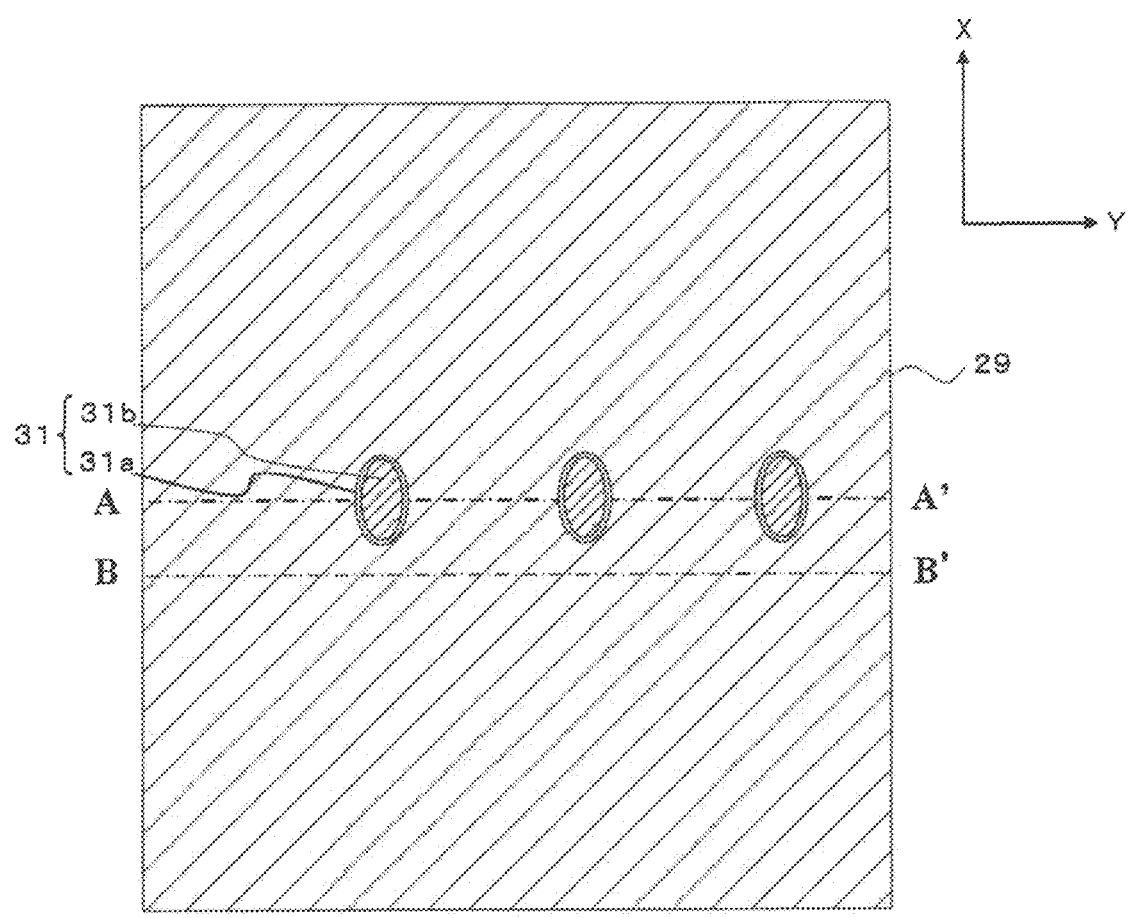
FIG. 7 is a plan view showing a manufacturing process of the semiconductor memory device following the process shown in FIG. 5.
Figure 8A:
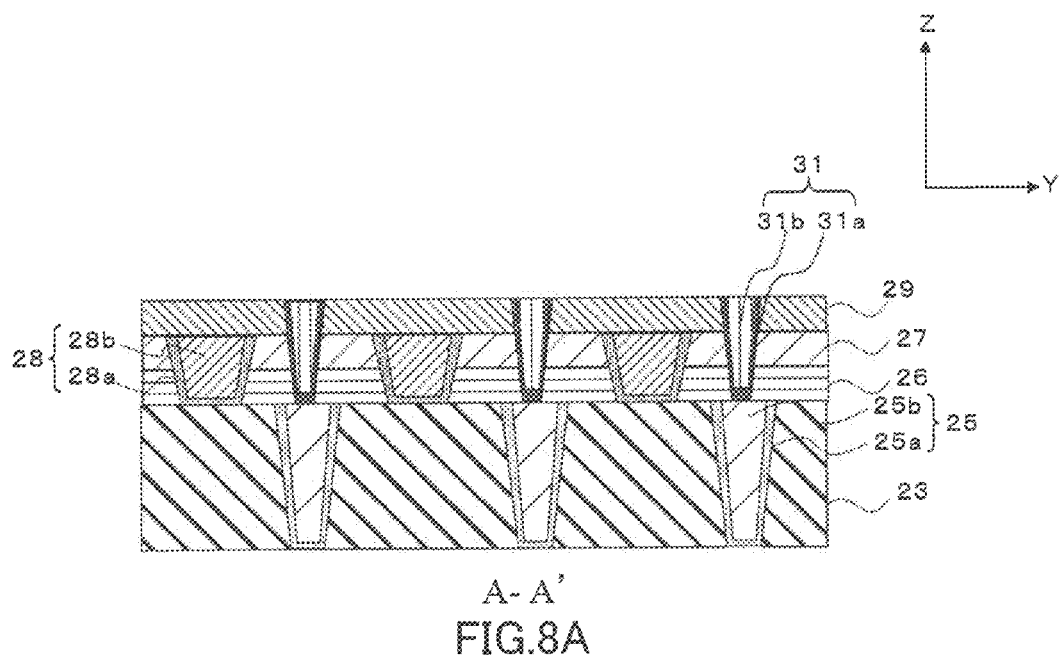
FIG. 8A is a cross-sectional view taken along the line A-A' of FIG. 7.
Figure 8B:
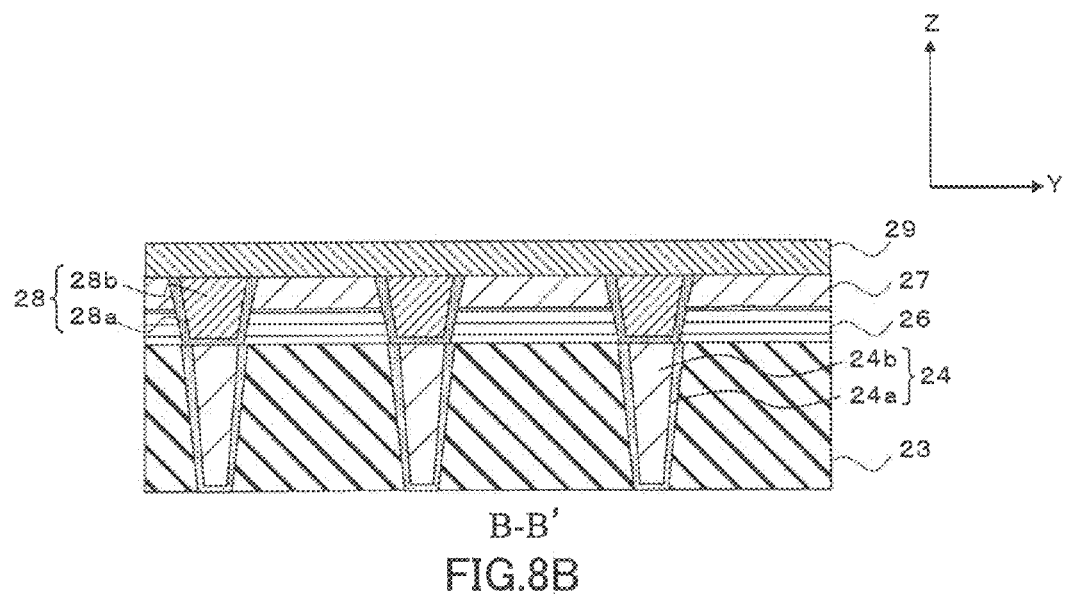
FIG. 8B is a cross-sectional view taken along the line B-B' of FIG. 7.
Figure 9:
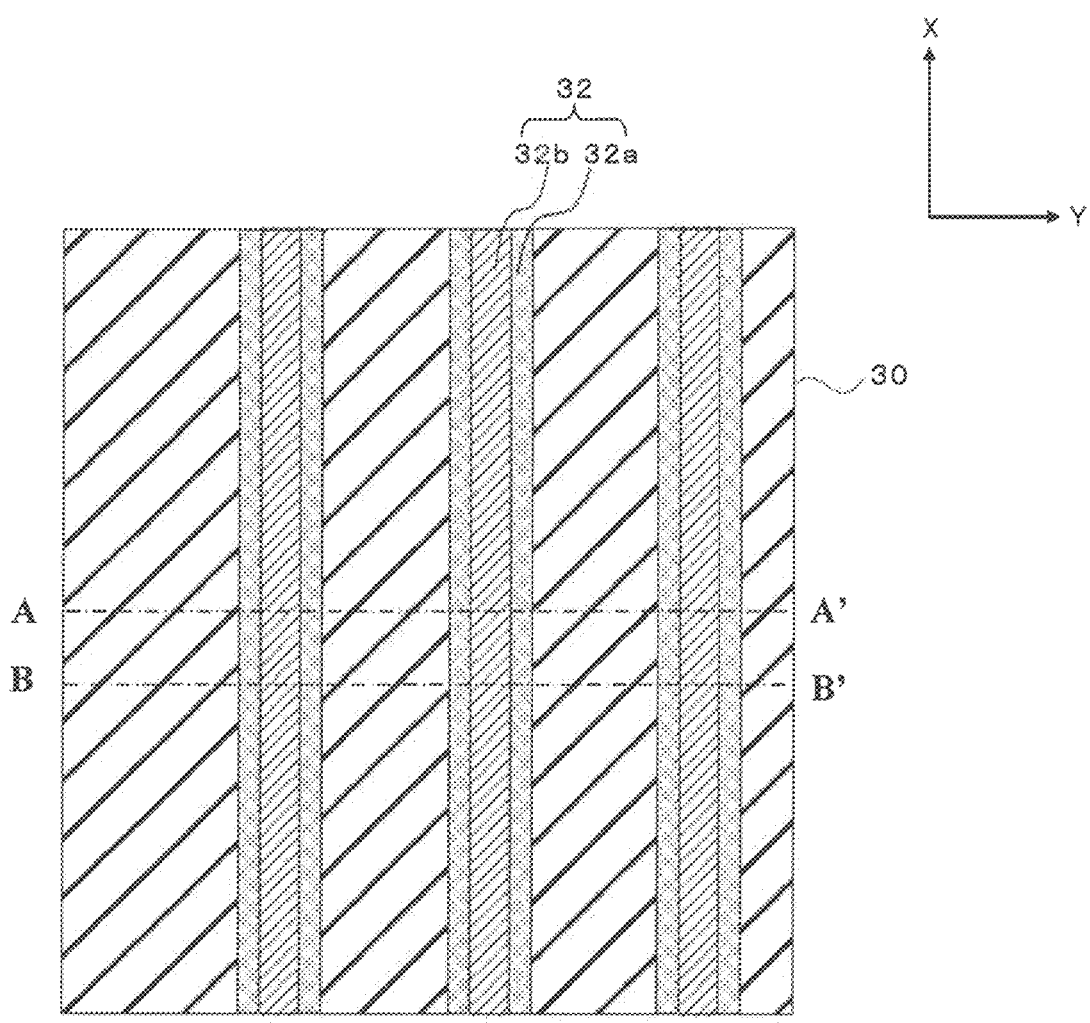
FIG. 9 is a plan view showing the manufacturing process of the semiconductor memory device shown in FIG. 2E.
Figure 10A:
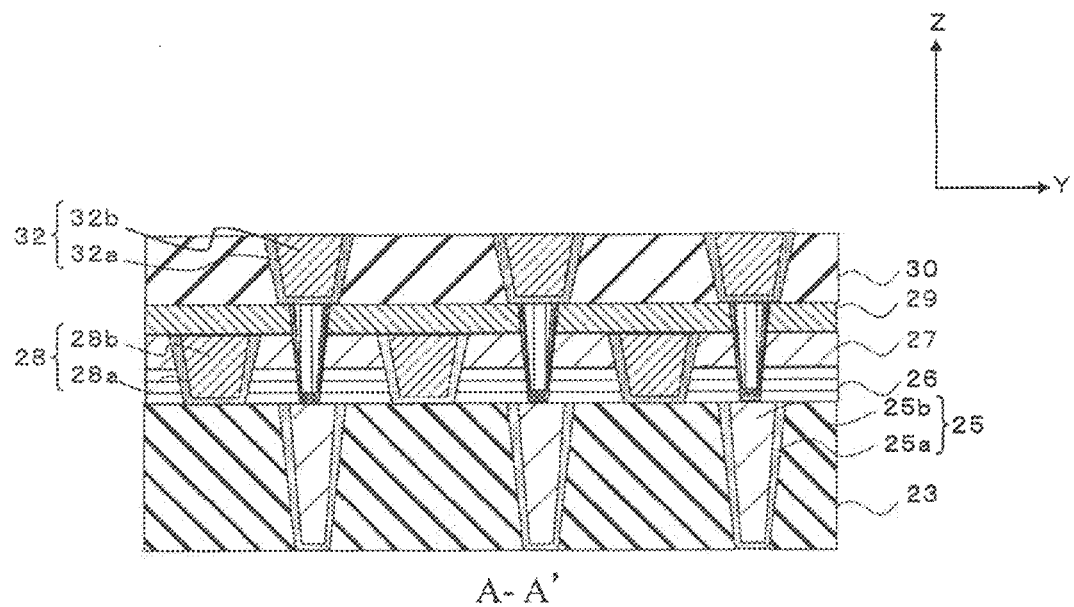
FIG. 10A is a cross-sectional view taken along the line A-A' of FIG. 9.
Figure 10B:
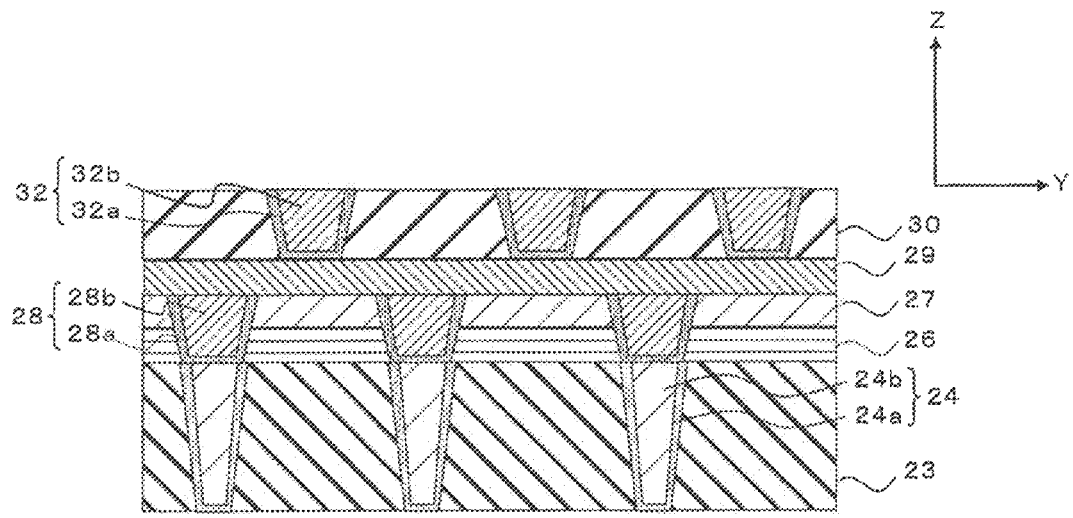
FIG. 10B is a cross-sectional view taken along the line B-B' of FIG. 9.

Subsequently, manufacturing processes up to FIG. 2E will be described by referring to FIGS. 2E and 7 to 10B. FIG. 7 is a plan view showing a manufacturing process of the semiconductor memory device following the process shown in FIG. 5. FIG. 8A is a cross-sectional view taken along the line A-A' of FIG. 7, and FIG. 8B is a cross-sectional view taken along the line B-B' of FIG. 7. FIG. 9 is a plan view showing the manufacturing process of the semiconductor memory device shown in FIG. 2E. FIG. 10A is a cross-sectional view taken along the line A-A' of FIG. 9, and FIG. 10B is a cross-sectional view taken along the line B-B' of FIG. 9.

Another etching-stopper film 29 (hereafter, referred to as the second etching-stopper film) is formed both on the first metal wirings 28 and on the third interlayer insulation film 27. After the surface of the second etching-stopper film 29 is flattened by, for example, CMP, photoresist is applied to the entire surface of this second etching-stopper film 29. Then, a resist pattern necessary for forming plugs 31 to connect the second upper-layer contact members 25 to the second metal wirings 32 is formed by a photolithography technique. The second metal wirings 32 will be described later. After that, using the resist pattern as a mask, the second etching-stopper film 29, the third interlayer insulation film 27, and the first etching-stopper film 26 are dry-etched exposing at least parts of the top surfaces of the second upper-layer contact members 25 in openings formed in the second etching-stopper film 29, the third interlayer insulation film 27, and the first etching-stopper film 26.

Films, each of which has a laminate structure, including a barrier metal layer 31a at the bottom and a via layer 31b at the top are formed respectively in these openings, and then the surfaces of the films are flattened by CMP so as to have a desired height. Thus, the plugs 31 are formed.

As FIGS. 7, 8A and 8B show, the openings formed in the second etching-stopper film 29, the third interlayer insulation film 27, and the first etching-stopper film 26 are formed only over the second upper-layer contact members 25.

After the formation of the plugs 31, an interlayer insulation film 30 (hereafter, referred to as the fourth interlayer insulation film) is formed, and then the surface of the interlayer insulation film 30 is flattened by, for example, CMP. Photoresist is applied to the entire surface of the fourth interlayer insulation film 30, and then a resist pattern necessary for forming the second metal wirings 32 is formed by a photolithography technique. The second metal wirings 32 will be described later. Thereafter, the fourth interlayer insulation film 30 is dry-etched using this resist pattern as a mask. Thus, openings exposing at least the top surfaces of the plugs 31 are formed in the fourth interlayer insulation film 30. Films, each of which has a laminate structure, including a barrier metal film 32a at the bottom and a metal film 32b at the top are formed respectively, in these openings. Then, the surfaces of the films are flattened by CMP, for example, so as to have a desired height. Thus, the second metal wirings 32 are formed (see FIG. 2E).

As FIGS. 9, 10A, and 10B show, the openings formed in the fourth interlayer insulation film 30 are formed only over the plugs 31.

Note that, in this embodiment, openings are formed in the fourth interlayer insulation film 30. If exposing the plugs 31 requires the dry-etching of the second etching-stopper film 29 as well, both the fourth interlayer insulation film 30 and the second etching-stopper film 29 are dry-etched to form the openings to expose the plugs 31.

The first interlayer insulation film 21 to the fourth interlayer insulation film 30 may be made, for example, of SiO2.

In the manner as described above, a semiconductor memory device can be manufactured which is capable of reducing the leakage current and the parasitic capacitance between the contact members and the wirings even if a misalignment occurs between a contact member and the wiring.

Figure 11:
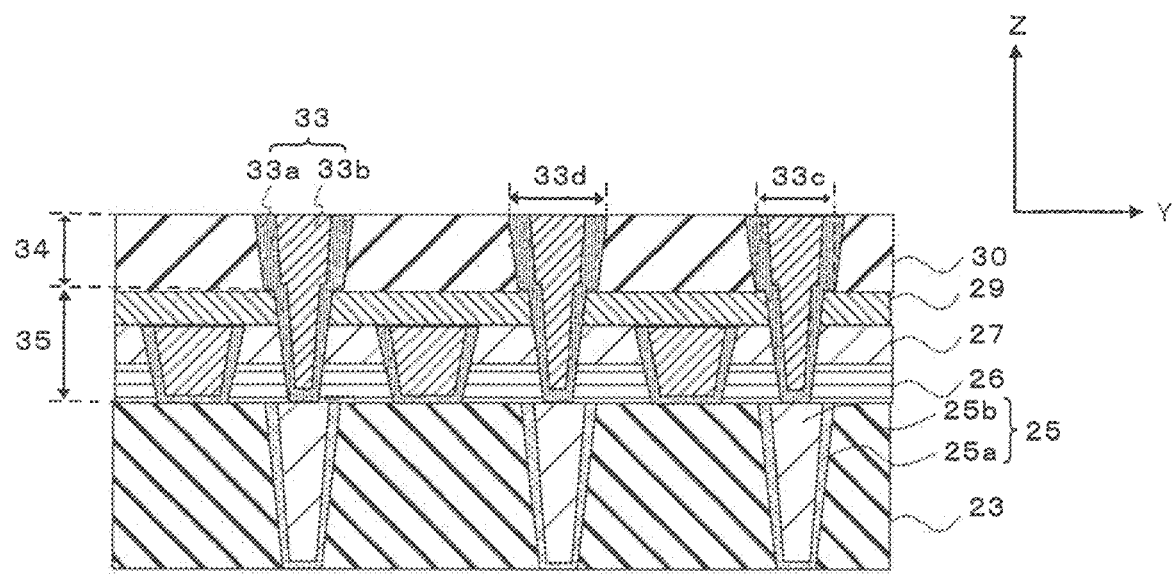
FIG. 11 is a cross-sectional view showing a manufacturing process (corresponding to FIG. 2E) of a case where the semiconductor memory device according to the first embodiment is manufactured by the dual damascene method.

In this first embodiment, the process for forming the plugs 31 and the process for forming the second metal wirings 32 are performed as different processes. However, both the plugs 31 and the second metal wirings 32 may be formed simultaneously by the dual damascene method. In general, the dual damascene method is a technique to simultaneously form wirings and contact-hole wirings (so called plugs) formed in contact holes by firstly forming both openings for wirings where wirings are buried and contact holes to connect the wirings on the upper side and the wirings on the lower side. Then, wiring materials are buried both in the openings for the wirings and in the contact holes. Next, the excess wiring materials that overflow from the openings for wirings are ground, for example in a CMP process. Hereafter, a specific method of manufacturing a semiconductor memory device including a process of simultaneously forming the plugs 31 and the second metal wirings 32 will be described by referring to FIG. 11. FIG. 11 is a cross-sectional view showing a manufacturing process (corresponding to FIG. 2E) of a case where the semiconductor memory device according to the first embodiment is manufactured by the dual damascene method.

The manufacturing processes up to FIG. 2D are the same in the manufacturing method employing the dual damascene method. No description of these processes will be given and only the process corresponding to FIG. 2E will be described.

After the process of FIG. 2D, a laminate film including the second etching-stopper film 29 at the bottom and the fourth interlayer insulation film 30 at the top is formed both on the first metal wirings 28 and on the third interlayer insulation film 27.

After the surface of the laminate film is flattened by, for example, CMP, photoresist is applied to the entire surface of this fourth interlayer insulation film 30. Then, a resist pattern necessary for forming portions 35 corresponding respectively to the plugs 31 is formed by a photolithography technique. Thereafter, both the second etching-stopper film 29 and the fourth interlayer insulation film 30 are dry-etched using this resist pattern as a mask so as to form, both in the second etching-stopper film 29 and in the fourth interlayer insulation film 30, openings exposing at least the top surfaces of the second upper-layer contact members 25. After that, photoresist is applied again, and then a resist pattern necessary for forming portions 34 corresponding, respectively, to the second metal wirings 32 is formed by a photolithography technique. The resist pattern includes patterns for the portions 34 each having a larger diameter than each of the portions 35 corresponding to the plugs 31. Thereafter, the fourth interlayer insulation film 30 is dry-etched using this photoresist as a mask so as to form openings. Each opening has a larger diameter than the diameter of each of the openings to form the portions 35 corresponding respectively to the plugs 31 in the fourth interlayer insulation film 30.

Then, films, each of which has a laminate structure, including a barrier metal film 33a at the bottom and a metal film 33b at the top are formed in the openings, and then the surfaces of the laminate-structure films are flattened by CMP so as to have a desired height. Thus, the metal wirings 33 (hereafter, referred to as the third metal wirings) are formed (see FIG. 11).

If the semiconductor memory device is manufactured by the dual damascene method, the third metal wirings 33 have the same functions as those that the second metal wirings 32 have.

As FIG. 11 shows, each of the third metal wirings 33 includes a portion 35 corresponding to the plug 31 and a portion 34 corresponding to the second metal wiring 32. It is preferable that the width (a distance 33c in FIG. 11) of the bottom surface of the portion 34 corresponding to the second metal wiring 32 in the Y-direction be smaller than the width (a distance 33d in FIG. 11) of the top surface of the portion 34 corresponding to the second metal wiring 32 in the Y-direction.

In this embodiment, when the first upper-layer contact members 24 and the plugs 31 are viewed from above, a zigzag-patterned structure is formed. Accordingly, in comparison to a case where the first metal wirings 28 and the second metal wirings 32 are arranged in the same layer in the Y-direction shown in FIG. 11, a longer distance can be secured between each first metal wiring 28 and the corresponding second metal wiring 32. In addition, the second metal wirings 32 exist in a layer different from the layer where the first metal wirings 28 exist, so that the parasitic capacitance can be reduced.

In addition, in this embodiment, each of the first metal wirings 28 and the second metal wirings 32 has a cross-sectional shape in which the width in the Y-direction of the top surface of each of these metal wirings is larger than the corresponding width of the bottom surface. Accordingly, in comparison to a case where metal wirings are provided in a layer different from the layer with the above-mentioned zigzag pattern, a longer distance can be secured between each of the first metal wirings and the corresponding second upper-layer contact members and between each of the second metal wirings and the corresponding first upper-layer contact members. Accordingly, the leakage current and parasitic capacitance between the contact members and the wirings can be reduced even if a misalignment occurs between a contact member and the wiring.

In this embodiment, copper is used as the metal for the first metal wirings 28, the second metal wirings 32, and the plugs 31. Accordingly, the resistance of the wirings and the plugs is reduced.

In the modified example of this embodiment, if the third metal wirings 33 are formed by the dual damascene method, the manufacturing processes can be shortened in comparison to a case of the first embodiment where both the plugs 31 and the second metal wirings 32 are formed. In the modified example of this embodiment, no barrier metal films 32a are formed between the portions 35 and the portions 34. In other words, the bottom surface of the metal film 32b is in direct contact with the top surfaces of the plugs 31. The material for the barrier metal film 32a is one with a relatively high resistivity such as, for example, TiN. Accordingly, in the case where copper is used as the metal, the copper has a lower resistivity than the barrier metal film 32a between the portions 35 and the portions 34, and the resistance of each of the bit lines that are formed with the second metal wirings 32 can be reduced.

Figure 12:
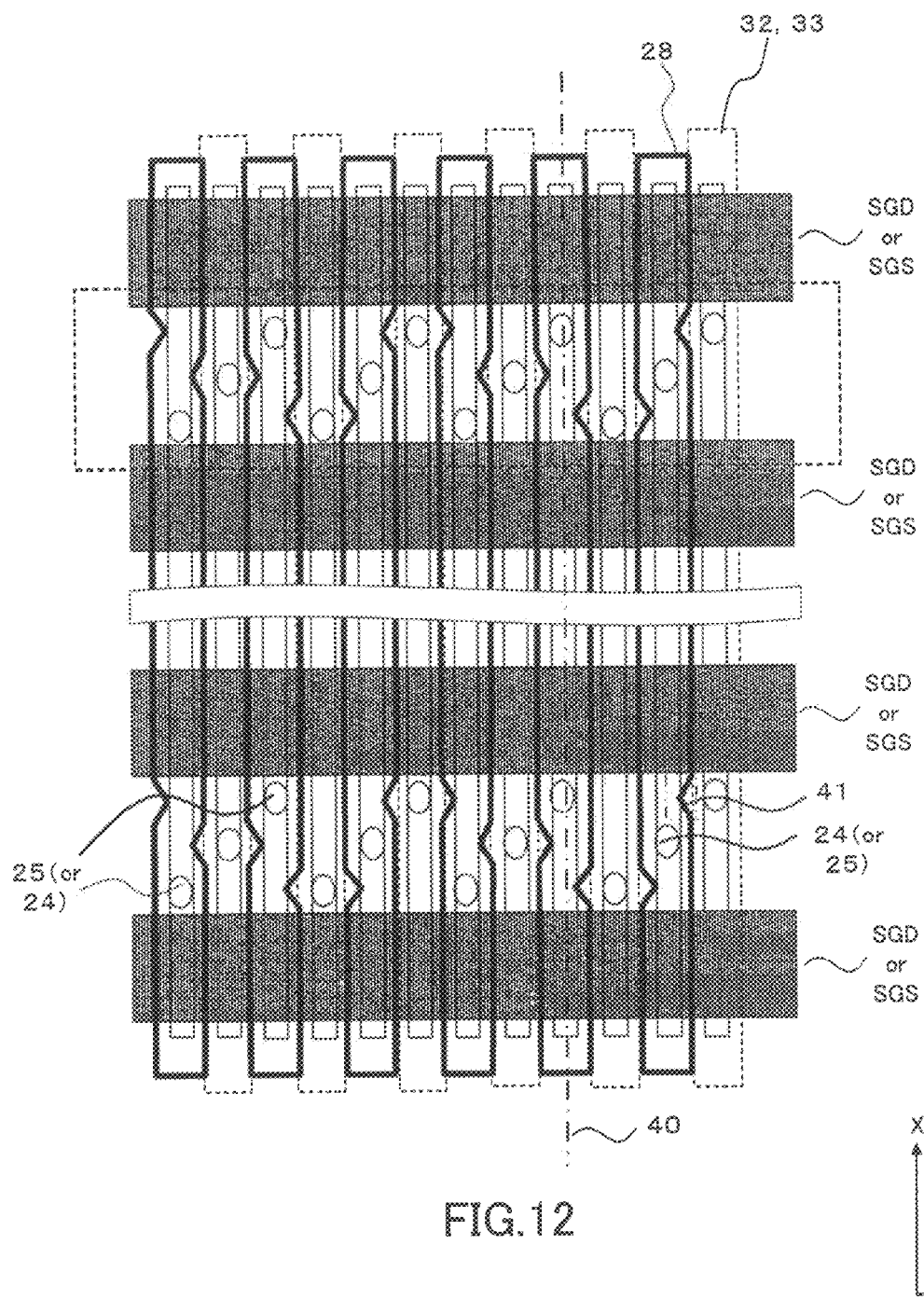
FIG. 12 is a plan view showing a manufacturing process of a semiconductor memory device according to a second embodiment.
Figure 13:
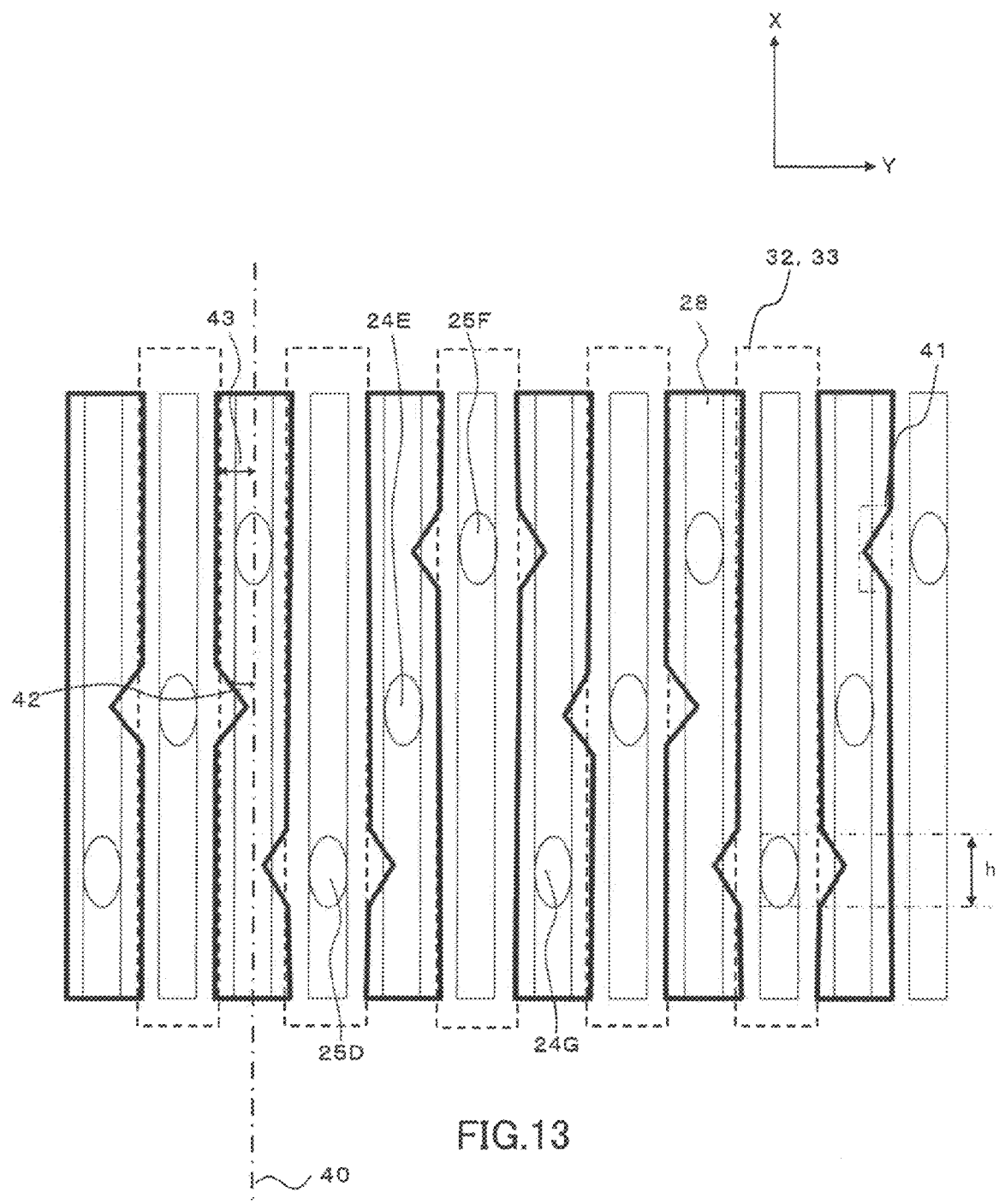
FIG. 13 is an enlarged view of a portion demarcated by the dashed lines in FIG. 12.

The configuration of a semiconductor memory device according to a second embodiment will be described by referring to FIGS. 12 and 13. FIG. 12 is a plan view showing a manufacturing process of a semiconductor memory device according to the second embodiment. FIG. 13 is an enlarged view of a portion demarcated by the dashed lines in FIG. 12.

The semiconductor memory device of the second embodiment differs from the semiconductor memory device of the first embodiment in the first upper-layer contact members 24, the second upper-layer contact members 25, and the first metal wirings 28. The other constituent portions of the semiconductor memory devices of the first and the second embodiments are the same. Accordingly, constituent portions of the semiconductor memory device other than the main ones are omitted in FIGS. 12 and 13. In addition, no detailed description will be given of those constituent portions that are identical to their counterparts of the first embodiment, while the different constituent portions will be described in the following description.

First, the positions where the first upper-layer contact members 24 and the second upper-layer contact members 25 are arranged will be described by referring to FIGS. 12 and 13.

As FIGS. 12 and 13 show, the first upper-layer contact members 24 and the second upper-layer contact members 25 together form a zigzag-patterned structure using three upper-layer contact members as one unit. The three members are either two first upper-layer contact members 24 and one second upper-layer contact member 25 or one first upper-layer contact member 24 and two second upper-layer contact members 25.

For the sake of a simple description of the zigzag-patterned structure, specific first upper-layer contact members 24E and 24G, and specific second upper-layer contact members 25D and 25F are used in the description of FIG. 13.

When the second upper-layer contact member 25D used as the reference, the first upper-layer contact member 24E that is adjacent to and on one side of the second upper-layer contact member 25D is arranged by being shifted in the X-direction. For example, in the case of FIG. 13, the first upper-layer contact member 24E is arranged on the corresponding active area AA by being shifted in the positive X-direction. In addition, the second upper-layer contact member 25F that is adjacent to and on the other side of the first upper-layer contact member 24E is arranged by being shifted in the X-direction from the first upper-layer contact member 24E used as the reference. The second upper-layer contact member 25F is also shifted in the same direction as the direction in which the first upper-layer contact member 24E is shifted from the second upper-layer contact member 25D. For example, in the case of FIG. 13, the second upper-layer contact member 25F is arranged on the corresponding active area AA by being shifted in the positive X-direction. At the same time, the first upper-layer contact member 24G adjacent to the second upper-layer contact member 25F is arranged at the same position in the X-direction as the position of the second upper-layer contact member 25D used as the reference. In this way, the zigzag-patterned structure is formed (hereafter the zigzag-patterned structure will be referred to the "triple zigzag pattern").

Subsequently, the first metal wirings 28 will be described by referring to FIGS. 12 and 13.

When each of the first metal wirings 28 of the semiconductor memory device according to the second embodiment of the invention is viewed from above, each of the first metal wirings 28 has contact-adjacent portions and a notch is provided in each of the contact-adjacent portions.

As FIG. 13 shows, in each of the first metal wirings 28, contact-adjacent portions 41 are provided in the portions to which either the corresponding plug 31 connected to the corresponding second metal wiring 32 (that is, the corresponding plug 31 connected to the second upper-layer contact members 25) or the corresponding third metal wiring 33 is adjacent. To be more specific, each contact-adjacent portion 41 has a length approximately equal to the length, in the X-direction, of each plug 31 (i.e., a distance h in FIG. 13). Each contact-adjacent portion 41 is provided at a position such that one of the contact-adjacent portions 41 is provided in each first metal wiring 28. The contact-adjacent portions 41 and the corresponding plug 31 can be arranged substantially on a line in the Y-direction.

In addition, if an axis 40 passing on a position at the center of the widest portion of the first metal wiring 28, measured in the direction perpendicular to the lengthwise direction of the first metal wiring 28 (i.e., measured in the Y-direction in FIG. 12), is used as the reference, a relationship between a distance 42 and a distance 43 is described next. Where the distance 42 is between the reference axis 40 and each of the contact-adjacent portions 41 of the first metal wiring 28, which is adjacent to the corresponding plug 31, and the distance 43 is between the reference axis 40 and each of the other portions of the first metal wiring 28 than the contact-adjacent portions 41, the relationship between the distance 42 and the distance 43 is given by Formula 1.

$$\text{Distance 42} < \text{Distance 43} \qquad \text{(Formula 1)}$$

Subsequently, manufacturing processes of the semiconductor memory device in the second embodiment will be described. The manufacturing processes other than the process of manufacturing the first metal wirings 28 are identical to their respective counterparts in the first embodiment. Those processes identical to their counterparts in the first embodiment will be omitted in the following description, and description will be given of the different processes.

As in the case of the first embodiment, after the formation of the laminate film which includes the first etching-stopper film 26 and the third interlayer insulation film 27 and whose surface has been flattened, photoresist is applied to the entire surface of the third interlayer insulation film 27, and then a desired resist pattern is formed by a photolithography technique. Here, the resist pattern is the one with notched portions.

By providing a notched portion in each of the first metal wirings 28, the distance between the corresponding plug 31 and the first metal wiring 28 can be made longer than the corresponding distance in the first embodiment. Accordingly, even if a misalignment of the plug 31 and the first metal wiring 28 occurs, the leakage current and the parasitic capacitance between the contact members and the wirings can be reduced.

The use of the triple zigzag pattern prevents the contact-adjacent portions 41 of each of the plurality of first metal wirings 28 from being adjacent to each other in the Y-direction. The contact-adjacent portions 41 are provided at such positions that each of the contact-adjacent portions 41 and the corresponding plug 31 are arranged substantially in a line in the Y-direction, but the plugs 31 are arranged not to sandwich any of the plurality of first metal wirings 28 in the Y-direction. This is because the two plugs 31 that sandwich the first metal wiring 28 are shifted from each other in the X-direction.

If the plurality of contact-adjacent portions 41 included in each of the plurality of first metal wirings 28 are adjacent to each other in the Y-direction, and if the contact-adjacent portions 41 are provided symmetrically with respect to the axis 40, a narrow portion is formed in the first metal wirings 28, and the possibility of breaking the first metal wirings 28 becomes higher. However, in this embodiment, the use of the triple zigzag pattern prevents the contact-adjacent portions 41 included in each of the plurality of first metal wirings 28 from being adjacent to each other in the Y-direction. Consequently, the possibility of breaking the first metal wirings 28 can be made lower.

Figure 14:
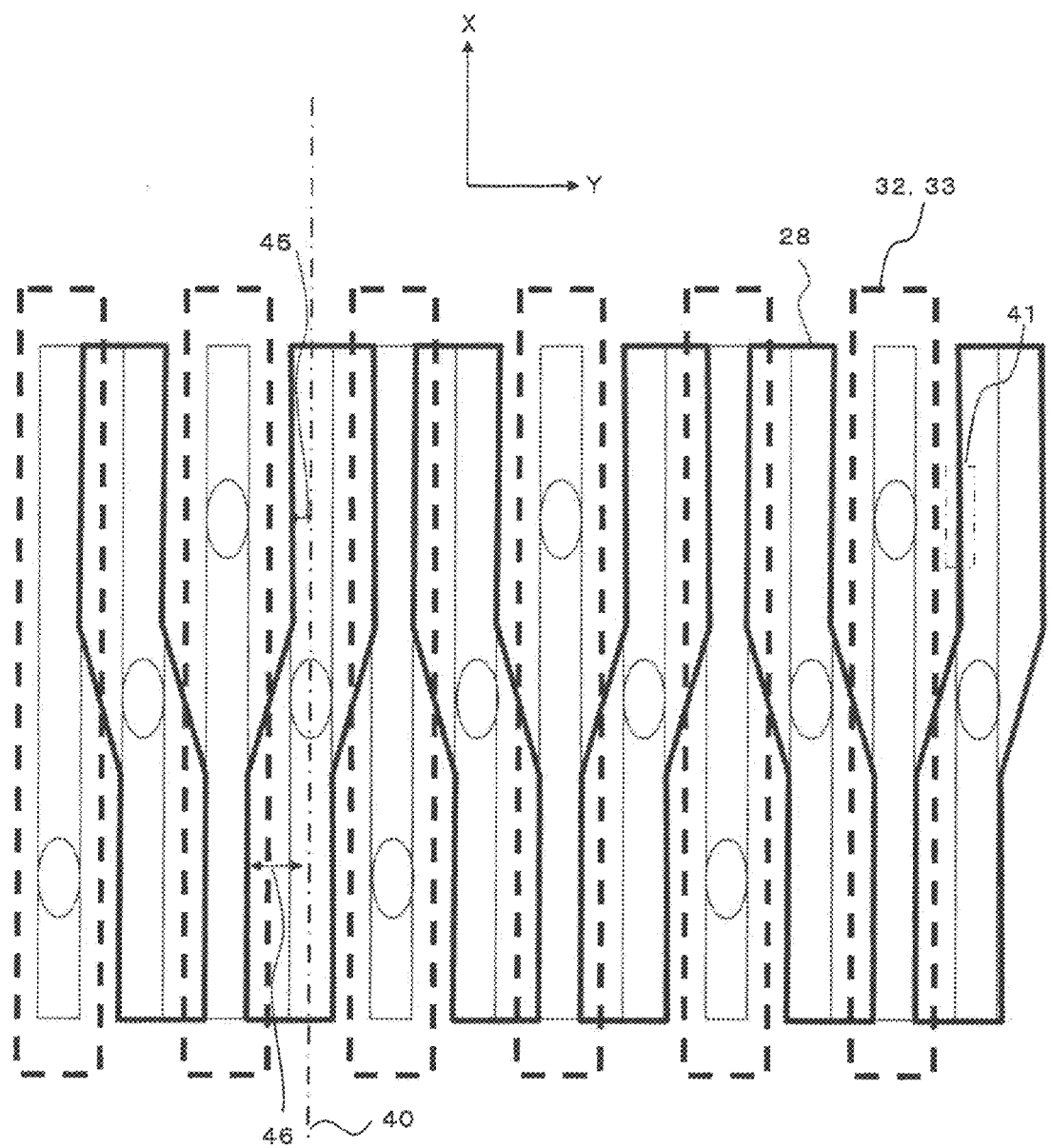
FIG. 14 is a plan view showing a manufacturing process of a semiconductor memory device according to a third embodiment.

The configuration of a semiconductor memory device according to a third embodiment will be described by referring to FIG. 14. FIG. 14 is a plan view showing a manufacturing process of the semiconductor memory device according to the third embodiment.

The semiconductor memory device of the third embodiment differs from the semiconductor memory device of the first embodiment in that the planar shapes of the first upper-layer contact members 24, the second upper-layer contact members 25, and the first metal wirings 28 when are viewed from above. Other constituent portions are common to these two embodiments. Accordingly, constituent portions of the semiconductor memory device other than the main ones are omitted in FIG. 14. In addition, no detailed description of those constituent portions identical to their counterparts of the first embodiment will be given, while the different constituent portions will be described in the following description.

The first upper-layer contact members 24 and the second upper-layer contact members 25 are arranged in the above-described triple zigzag pattern. This structure is similar to that of the second embodiment and the description is omitted. The first metal wirings 28 will be described by referring to FIG. 14.

As FIG. 14 shows, each of the second metal wirings 32 extends substantially straight in the X-direction when viewed from above. In addition, the width of each second metal wiring 32 may be larger than the width of each first metal wiring 28. When viewed from above, each first metal wiring 28 is arranged so that the first metal wiring 28 may be overlapped by one of the second metal wirings 32 that is adjacent to that first metal wiring 28 in the Y-direction. While extending in the X-direction, each first metal wiring 28 curves in the Y-direction so as to avoid the corresponding plug 31.

If an axis 40 that is similar to the one shown in FIG. 12 (i.e., an axis passing on a position at the center of the widest portion of the first metal wiring 28, in the direction perpendicular to the lengthwise direction of each active area AA) is used as the reference, the relationship between a distance 45 and a distance 46 is given by Formula 2. The distance 45 is that between the reference axis 40 and each of the contact-adjacent portions 41 of the first metal wiring 28, which is adjacent to the corresponding plug 31. The distance 46 is that between the reference axis 40 and each of the other portions of the first metal wiring 28 than the contact-adjacent portions 41.

$$\text{Distance 45} < \text{Distance 46} \qquad \text{(Formula 2)}$$

To put it differently, each first metal wiring 28 extends in the Y-direction by curving so as to move away from the corresponding plug 31. Consequently, the distance between each first metal wiring 28 and the corresponding plug 31 can be made longer. Accordingly, the leakage current and parasitic capacitance between the plugs and the wirings can be reduced even if a misalignment occurs between one of the plugs 31 and the first metal wiring 28.

In addition, even if no notches are formed in the adjacent portions of the first metal wirings 28, the distance between each plug 31 and the corresponding first metal wiring 28 can be made longer. Consequently, each first metal wiring 28 does not have narrow portions, so that the resistance of each first metal wiring 28 can be decreased.

In addition, each second metal wiring 32 can be formed wider. Consequently, the resistance of each second metal wiring 32 can be decreased.

In the third embodiment, each first metal wiring 28 extends in the Y-direction by curving so as to move away from the corresponding plug 31, and when viewed from above, there are overlapping portions between the first metal wirings 28 and the second metal wirings 32. In this modified example, overlapping portions between the first metal wirings 28 and the second metal wirings 32 for each memory-cell block will be described.

Figure 15A:
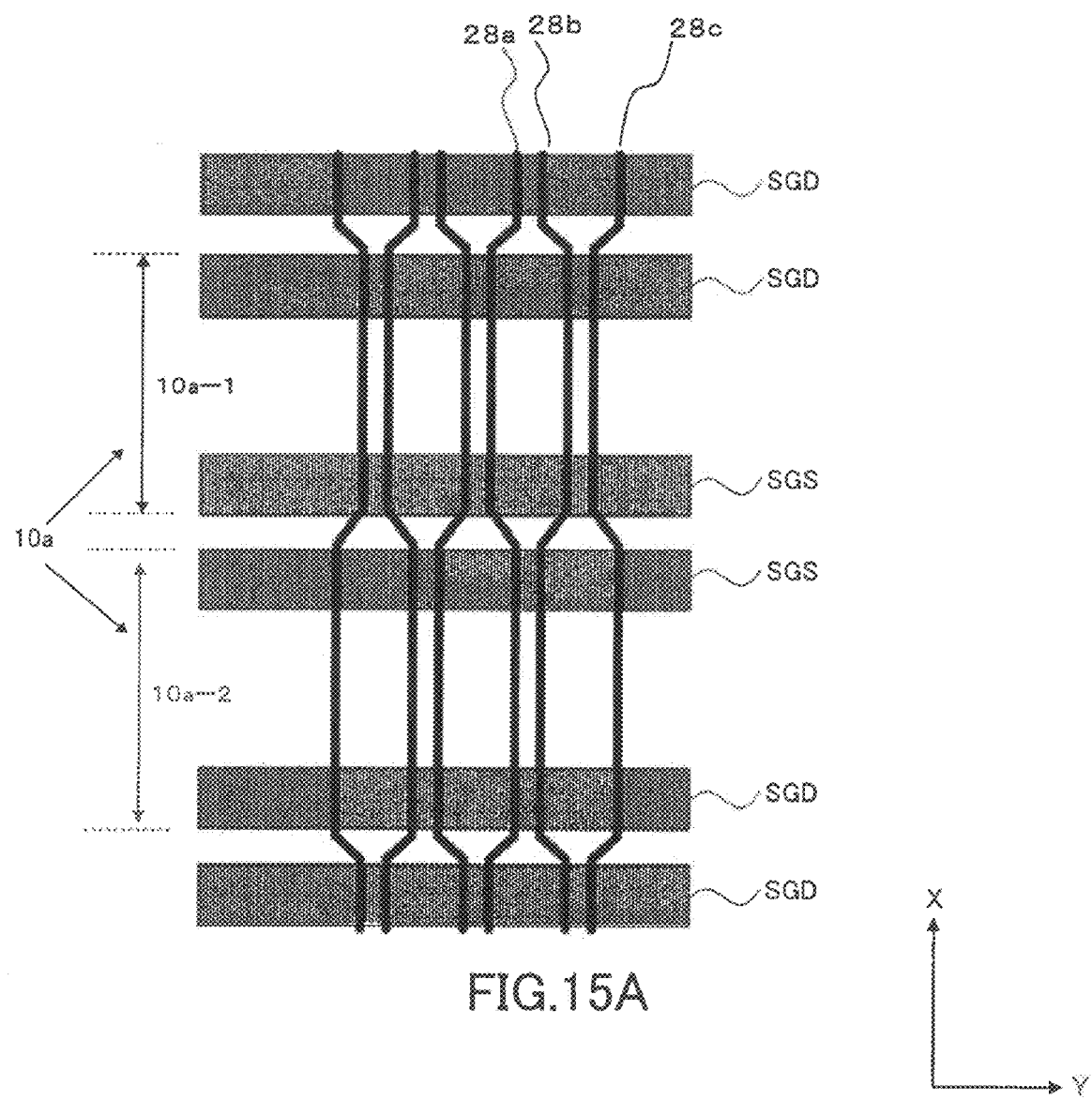
FIG. 15A is a plan view showing a modified example of the manufacturing process of the semiconductor memory device according to the third embodiment.

FIG. 15A is a plan view showing a modified example of the manufacturing process of the semiconductor memory device according to the third embodiment. Memory-cell blocks 10a which are the areas where the NAND strings 10, which correspond to the areas in FIG. 1, are formed from a selection gate SGD on the bit-line contact-area side to a selection gate SGS on the source-line contact-area side. The memory-cell blocks 10a are arranged in the X-direction so that, in the memory-cell blocks 10a that are adjacent to each other, the selection gates SGD on the bit-line contact-area side are opposed to the adjacent selection gates SGS on the source-line contact-area side. In FIG. 15A, for the sake of simplicity, members other than selection gate lines SGD and SGS, and the first metal wirings 28 are omitted.

Figure 15B:
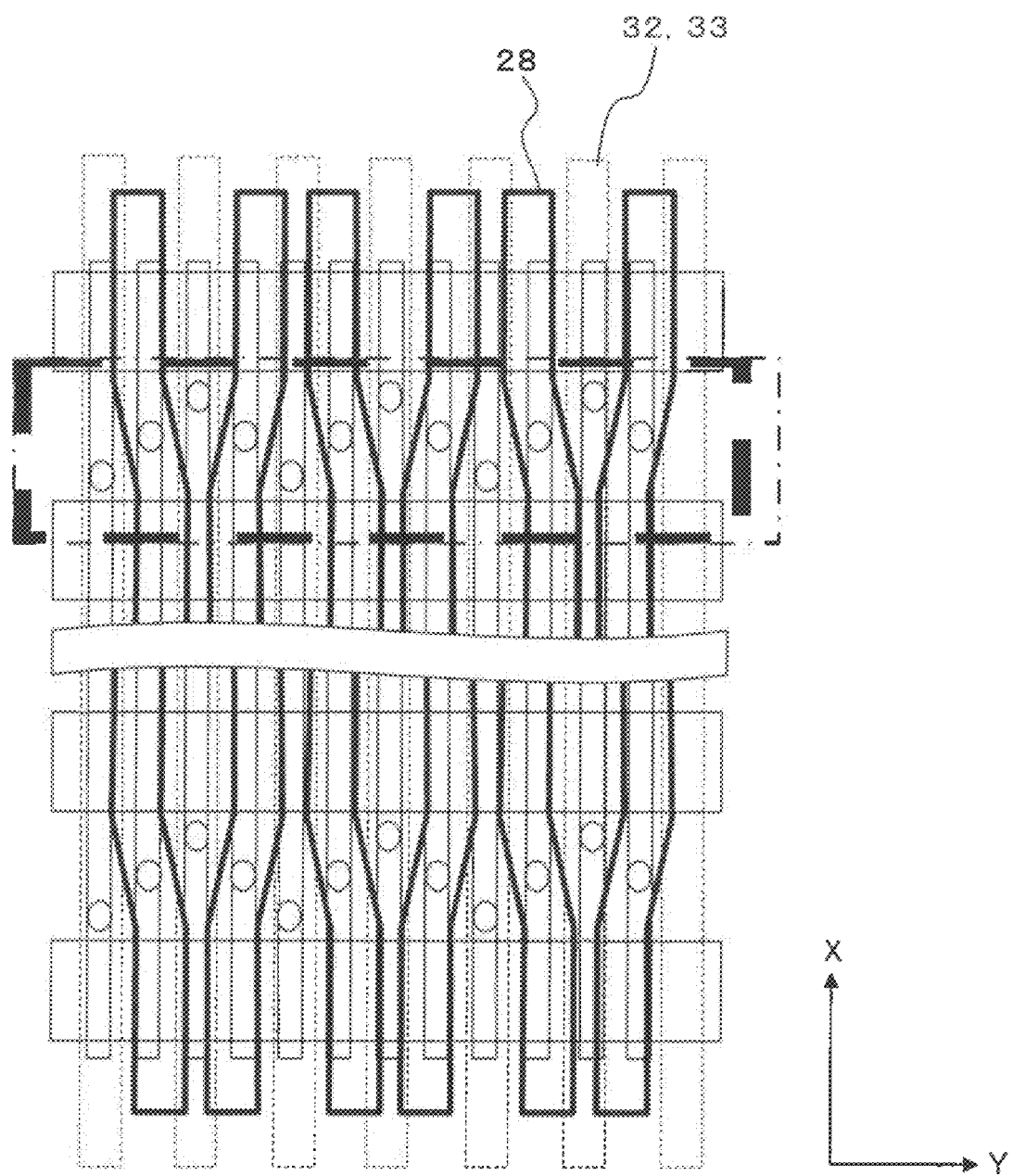
FIG. 15B is an enlarged view of FIG. 15A.

FIG. 15B is an enlarged view of FIG. 15A. As FIG. 15B shows, when viewed from above, each second metal wiring 32 extends substantially straight in the X-direction. In addition, the width of each second metal wiring 32 may be larger than the width of each first metal wiring 28. In each memory-cell block 10a, when viewed from above, each first metal wiring 28 is arranged so that the first metal wiring 28 may be overlapped by one of the second metal wirings 32 that is adjacent to that first metal wiring 28 in the Y-axis direction. The overlapping of these first metal wirings 28 and the corresponding second metal wiring 32 occurs by changing the first metal wirings 28 that are adjacent in the Y-axis direction for each memory-cell block 10a.

For example, in the memory-cell block 10a-1 shown in FIG. 15A, the first metal wiring 28b may be overlapped by the second metal wiring 32 adjacent thereto in the positive Y-axis direction, whereas, in the memory-cell block 10a-2, the first metal wiring 28b may be overlapped by the second metal wiring 32 adjacent thereto in the negative Y-axis direction.

Each first metal wiring 28 extends in the X-axis direction while being shifted in the Y-axis direction for each memory-cell block 10a. For example, in the memory-cell block 10a-1, the particular first metal wiring 28b is arranged so as to come closer to the first metal wiring 28c adjacent thereto in the positive Y-axis direction rather than to the first metal wiring 28a adjacent thereto in the negative Y-axis direction, In contrast, in the memory-cell block 10a-2, the particular first metal wiring 28b is arranged so as to come closer to the first metal wiring 28a adjacent thereto in the negative Y-axis direction rather than to the first metal wiring 28c adjacent thereto in the positive Y-axis direction.

As a consequence, in comparison to a case where each first metal wiring 28 may be overlapped by the second metal wiring 32 on the same side in all the memory-cell blocks 10a, the parasitic capacitance can be made more uniform. For example, if the distance between adjacent first metal wirings 28 is narrow in the memory-cell block 10a, inter-cell interference occurs for each memory-cell block 10a when data in the memory-cell blocks 10a is read. In contrast, with the first metal wirings 28 arranged in the manner of this embodiment, when data in memory-cell block 10a-1 is read, and if the piece of data stored in the memory cell connected to the first metal wiring 28a is a "1" and the piece of data stored in the memory cell connected to the adjacent first metal wiring 28b is a "0", inter-cell interference occurs only in the memory-cell block 10a-2, but not in the memory-cell block 10a-1.

Likewise, if, as in this embodiment, each first metal wiring 28 alternately overlaps the second metal wiring 32 adjacent thereto in the positive Y-direction, and the second metal wiring 32 adjacent thereto in the negative Y-direction, even if the piece of data stored in one of the adjacent memory cells is different, the inter-cell interference can be reduced by half as long as the piece of data stored in the other one of the adjacent memory cells coincides.

Note that this overlapping is not limited to the case where the overlapping occurs in different manners for each adjacent memory-cell block. What is needed is that the overlapping in the different manner occurs in occasions of approximately half the number of all the memory-cell blocks to which each first metal wiring 28b is connected.

Subsequently, manufacturing processes of the semiconductor memory device of the third embodiment will be described. The manufacturing processes other than the manufacturing process of the first metal wiring 28 are identical to their respective counterparts in the first embodiment, so that no detailed description of those processes identical to their counterparts of the first embodiment will be given, while the different process will be described in the following description.

As in the case of the first embodiment, after the formation of a laminate film including the first etching-stopper film 26 and the third interlayer insulation film 27 with the surface of the laminate film being flattened, photoresist is applied to the entire surface of this third interlayer insulation film 27. Then, a desired resist pattern is formed by a photolithography technique. This resist pattern has a shape such that, when the first metal wirings 28 and the second metal wirings 32 are viewed from above, each first metal wiring 28 and each second metal wiring 32 extend in a direction parallel to the lengthwise direction of each active area AA so that each first metal wiring 28 can be overlapped by a portion of the corresponding second metal wiring 32.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a substrate;
a plurality of first upper-layer contact members formed over the substrate in a first layer;
a plurality of second upper-layer contact members formed over the substrate in the first layer, arranged alternately with the plurality of first upper-layer contact members in a first direction, and shifted from the plurality of first upper-layer contact members in a second direction orthogonal to the first direction;
a plurality of plugs formed respectively on the plurality of second upper-layer contact members and made of a metal;
a plurality of first metal wirings provided respectively on the plurality of first upper-layer contact members and made of a metal; and
a plurality of second metal wirings provided respectively on the plurality plugs and made of a metal, wherein
a height of a top surface of each of the plurality of plugs, measured from the substrate, is higher than a height of a top surface of each of the plurality of first metal wirings, measured from the substrate,
a width of a bottom surface of each of the plurality of first metal wirings in a shorter-side direction is shorter than a width of a top surface of each of the plurality of first metal wirings in the shorter-side direction, and
a width of a bottom surface of each of the plurality of second metal wirings in a shorter-side direction is shorter than a width of a top surface of each of the plurality of second metal wirings in the shorter-side direction.

2. The semiconductor memory device according to claim 1, wherein the width of each of the plurality of first metal wirings and the width of each of the plurality of the second metal wirings, in the shorter-side direction, increases from the bottom surface to the top surface.

3. The semiconductor memory device according to claim 1, wherein the plurality of first upper-layer contact members and the plurality of second upper-layer contact members are formed on a plurality of lower-layer contact members which are formed on the substrate.

4. The semiconductor memory device according to claim 2, wherein the plurality first upper-layer contact members and the plurality of second upper-layer contact members are formed on a plurality of lower-layer contact members which are formed on the substrate.

5. The semiconductor memory device according to claim 1, wherein each of the plurality of plugs and the corresponding one of the plurality of second metal wirings are formed as an integral body.

6. The semiconductor memory device according to claim 1, wherein the plurality of plugs, the plurality of first metal wirings, and the plurality of second metal wirings are made of copper.

7. The semiconductor memory device according to claim 5, wherein the plurality of plugs, the plurality of first metal wirings, and the plurality of second metal wirings are made of copper.

8. A semiconductor memory device, comprising:
   a substrate;
   a plurality of first upper-layer contact members formed over the substrate in a first layer;
   a plurality of second upper-layer contact members formed over the substrate in the first layer, arranged alternately with the plurality of first upper-layer contact members in a first direction, and provided to be shifted from the plurality of first upper-layer contact members in a second direction orthogonal to the first direction;
   a plurality of plugs formed respectively on the plurality of second upper-layer contact members and made of a metal;
   a plurality of first metal wirings provided respectively on the plurality of first upper-layer contact members and made of a metal;
   a contact-adjacent portion provided in each of the plurality of first metal wirings; and
   a plurality of second metal wirings provided respectively on the plurality of plugs and made of a metal, wherein
   a height of a top surface of each of the plurality of plugs, measured from the substrate, is higher than a height of a top surface of each of the plurality of first metal wirings, measured from the substrate,
   a width of a bottom surface of each of the plurality of first metal wirings in a shorter-side direction is shorter than a width of a top surface of each of the plurality of first metal wirings, in the shorter-side direction,
   a width of a bottom surface of each of the plurality of second metal wirings in a shorter-side direction is shorter than a width of a top surface of each of the plurality of second metal wirings in the shorter-side direction, and
   a distance between the contact-adjacent portions of the plurality of first metal wirings adjacent to each other is longer than a distance between portions of the adjacent first metal wirings other than the contact-adjacent portions.

9. The semiconductor memory device according to claim 8, further comprising an axis passing through a position at the center of the widest portion of each of the plurality of first metal wirings in the shorter-side direction of the first metal wiring, wherein
   a distance between the axis and the contact-adjacent portion the first metal wiring is shorter than a distance between the axis and each of the portions of the first metal wiring other than the contact-adjacent portion.

10. The semiconductor memory device according to claim 9, wherein
   the contact-adjacent portion is an edge of each of the plurality of first metal wirings facing the corresponding plug, and
   a notch is provided in the contact-adjacent portion.

11. The semiconductor memory device according to claim 9, wherein the contact-adjacent portion and the corresponding plug are arranged substantially in a line in the shorter-side direction of each of the plurality of first metal wirings.

12. The semiconductor memory device according to claim 9, wherein each of the plurality of first metal wirings curves in the shorter-side direction of each of the plurality of first metal wirings so as to avoid the corresponding plug.

13. The semiconductor memory device according to claim 12, wherein when viewed from above, each of the plurality of first metal wirings are overlapped by one of the plurality of second metal wirings that are adjacent to the first metal wiring.

14. The semiconductor memory device according to claim 13, wherein
   when the plurality of first metal wirings and the plurality of second metal wirings are viewed from above, overlapping portions in which the plurality of first metal wirings and the plurality of second metal wirings overlap each other include a first overlapping portion where each of the plurality of first metal wirings are overlapped by one of the plurality of second metal wirings adjacent to the first metal wiring, and a second overlapping portion where the first metal wiring is overlapped by the other one of the plurality of second metal wirings adjacent to the first metal wiring, and
   the first overlapping portion has an area substantially equal to an area of the second overlapping portion.

15. The semiconductor memory device according to claim 14, wherein the first overlapping portion and the second overlapping portion are point-symmetric with each other with respect to the first upper-layer contact member.

16. The semiconductor memory device according to claim 8, further comprising:
   a plurality of memory cells,
   a plurality of NAND strings each including a selection gate transistor connected in series to two ends, in the lengthwise direction of one of the plurality of first metal wirings, of the plurality of memory cells; and
   a plurality of blocks each including a plurality of the NAND strings arranged in the shorter-side direction of the plurality of first metal wirings, wherein
   the plurality of blocks are arranged in the lengthwise direction of each of the plurality of first metal wirings and adjacent to one another in the lengthwise direction of each of the plurality of first metal wirings so that the plurality of NAND strings included in the plurality of blocks are connected to one another in series,
   the plurality of first upper-layer contact members are individually connected to first NAND strings of the plurality of NAND strings, and
   the plurality of second upper-layer contact members are connected to second NAND strings of the plurality of NAND strings that are adjacent to the first NAND strings between the blocks.

17. A method of manufacturing a semiconductor memory device, comprising:
   forming a first interlayer-insulating film on a substrate;
   forming contact holes in the first interlayer-insulating film in a zigzag pattern;
   forming lower-layer contact members in the contact holes;
   forming a second interlayer-insulating film on the first interlayer-insulating film;
   forming zigzag-patterned openings in the second interlayer-insulating film to expose top surfaces of the lower-layer contact members; and forming upper-layer contact members in the openings in the second interlayer-insulating film.

18. The method of claim 17, further comprising:
forming a third interlayer-insulating film;
forming openings in the third interlayer-insulating film;
forming metal wirings in the openings of the third interlayer-insulating film.

19. The method of claim 17, wherein the contact holes are arranged alternately in a first direction and shifted in a second direction orthogonal to the first direction thereby creating the zigzag pattern.

\* \* \* \* \*